(12) United States Patent
Sarti

(10) Patent No.: US 11,284,532 B1
(45) Date of Patent: Mar. 22, 2022

(54) DATA CENTER SYSTEMS INCLUDING HIGH VOLTAGE DIRECT CURRENT POWER GENERATORS

(71) Applicant: Meta Platforms, Inc., Menlo Park, CA (US)

(72) Inventor: Pierluigi Sarti, Milpitas, CA (US)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/825,092

(22) Filed: Mar. 20, 2020

Related U.S. Application Data

(62) Division of application No. 16/149,741, filed on Oct. 2, 2018, now Pat. No. 10,624,229, which is a division of application No. 15/153,348, filed on May 12, 2016, now Pat. No. 10,123,450.

(51) Int. Cl.
*H05K 7/14* (2006.01)
*H02M 7/06* (2006.01)
*H02M 1/42* (2007.01)

(52) U.S. Cl.
CPC ........ *H05K 7/1492* (2013.01); *H02M 1/4216* (2013.01); *H02M 7/06* (2013.01); *H02M 7/068* (2013.01)

(58) Field of Classification Search
CPC .... H05K 7/1492; H02M 1/4216; H02M 7/06; H02M 7/068
See application file for complete search history.

(56) References Cited

U.S. PATENT DOCUMENTS

| | | |
|---|---|---|
| 4,180,846 A | 12/1979 | Wilson et al. |
| 5,196,987 A | 3/1993 | Webber et al. |
| 5,646,509 A | 7/1997 | Berglund et al. |
| 6,239,579 B1 | 5/2001 | Dunn et al. |
| 6,295,215 B1 | 9/2001 | Faria et al. |
| 6,340,306 B1 | 1/2002 | Daoud |
| 6,347,950 B1 | 2/2002 | Yokoyama et al. |
| 7,500,867 B1 | 3/2009 | Doglio et al. |
| 7,581,972 B2 | 9/2009 | Daamen |
| 7,880,438 B1 | 2/2011 | Cohen et al. |

(Continued)

OTHER PUBLICATIONS

Non-Final Office Action received for U.S. Appl. No. 15/153,348 dated Feb. 5, 2018, 50 pages.

(Continued)

*Primary Examiner* — Jared Fureman
*Assistant Examiner* — Duc M Pham
(74) *Attorney, Agent, or Firm* — FisherBroyles, LLP

(57) ABSTRACT

Some embodiments include a high voltage direct current (HVDC) power generator system for information technology (IT) racks. The HVDC power generator system can include a three-phase alternating current (AC) transformer having a primary winding and a plurality of secondary windings. A plurality of three-phase bridge rectifier circuits can be electrically coupled respectively to the plurality of secondary windings. The HVDC power generator system can include output terminals for powering its load. A first string of bridge rectifier circuits can be in series with each other and a first inductor. A second string of bridge rectifier circuits can be in series with each other and a second inductor. The first and second strings can be electrically coupled in parallel to the output terminals.

5 Claims, 11 Drawing Sheets

(56) References Cited

U.S. PATENT DOCUMENTS

| | | |
|---|---|---|
| 7,892,108 B2 | 2/2011 | Kuo |
| 7,974,796 B2 | 7/2011 | Tamai |
| 8,879,241 B2 | 11/2014 | Lu et al. |
| 8,911,250 B2 | 12/2014 | Ehlen et al. |
| 9,048,691 B2 | 6/2015 | Crane et al. |
| 9,110,107 B2 | 8/2015 | Busca et al. |
| 9,148,068 B2 | 9/2015 | Sarti |
| 9,320,166 B1 | 4/2016 | Marr et al. |
| 9,331,409 B2 | 5/2016 | Naganuma et al. |
| 9,337,597 B2 | 5/2016 | Daamen et al. |
| 9,489,024 B2 | 11/2016 | Tsai et al. |
| 9,552,031 B2 | 1/2017 | Sarti |
| 9,590,370 B1 | 3/2017 | Lee |
| 9,622,373 B1 | 4/2017 | Sarti |
| 9,698,577 B2 | 7/2017 | Yi |
| 10,123,450 B2 | 11/2018 | Sarti |
| 2002/0171985 A1 | 11/2002 | Duffy et al. |
| 2003/0197428 A1 | 10/2003 | Hatton et al. |
| 2004/0183377 A1* | 9/2004 | Levin ............ H02J 3/01 307/14 |
| 2005/0146223 A1 | 7/2005 | Kanouda et al. |
| 2005/0162830 A1 | 7/2005 | Wortman et al. |
| 2005/0221629 A1 | 10/2005 | Woellner et al. |
| 2006/0120170 A1 | 6/2006 | Chen et al. |
| 2008/0007978 A1 | 1/2008 | Han |
| 2009/0164820 A1 | 6/2009 | Abraham |
| 2009/0212631 A1 | 8/2009 | Taylor et al. |
| 2010/0072824 A1 | 3/2010 | Abolhassani et al. |
| 2011/0057724 A1 | 3/2011 | Pabon |
| 2012/0013186 A1 | 1/2012 | Sarti |
| 2012/0153720 A1 | 6/2012 | Chang et al. |
| 2012/0290236 A1 | 11/2012 | Majima |
| 2013/0058028 A1 | 3/2013 | Lu et al. |
| 2013/0154365 A1 | 6/2013 | Sarti |
| 2013/0227309 A1 | 8/2013 | Jau et al. |
| 2013/0279129 A1 | 10/2013 | Xie et al. |
| 2014/0099806 A1 | 4/2014 | Ehlen et al. |
| 2014/0247629 A1 | 9/2014 | Crane et al. |
| 2015/0036272 A1 | 2/2015 | Tachibana et al. |
| 2015/0177808 A1* | 6/2015 | Sarti ............ G06F 1/30 713/300 |
| 2015/0180233 A1 | 6/2015 | Kamada et al. |
| 2015/0180234 A1 | 6/2015 | Bailey et al. |
| 2015/0245531 A1 | 8/2015 | Meinecke et al. |
| 2016/0187945 A1 | 6/2016 | Tsai et al. |
| 2016/0262282 A1 | 9/2016 | Li et al. |
| 2016/0268915 A1 | 9/2016 | Lin et al. |
| 2016/0329689 A1 | 11/2016 | Yi |
| 2017/0074946 A1 | 3/2017 | Ebrahimzadeh et al. |
| 2017/0094829 A1 | 3/2017 | Sarti |
| 2017/0098956 A1 | 4/2017 | Sarti |
| 2017/0164505 A1 | 6/2017 | Sarti |

OTHER PUBLICATIONS

Notice of Allowance received for U.S. Appl. No. 15/153,348 dated Jul. 6, 2018, 35 pages.
Final Office Action received for U.S. Appl. No. 14/853,526 dated Sep. 14, 2017, 31 pages.
Non-Final Office Action received for U.S. Appl. No. 14/958,648 dated Sep. 22, 2017, 44 pages.
Restriction Requirement received for U.S. Appl. No. 14/873,585 dated Oct. 23, 2017, 5 pages.
Non-Final Office Action received for U.S. Appl. No. 14/853,526 dated Mar. 17, 2017, 42 pages.
Corrected Notice of Allowability received for U.S. Appl. No. 14/941,005 dated Feb. 24, 2017, 4 pages.
U.S. Appl. No. 15/377,957 by Sarti, P., filed Dec. 13, 2016, 58 pages.
Choi et al., "New 24-Pulse Diode Rectifier Systems for Utility Interface of High-Power AC Motor Drives", IEEE Transactions on Industry Applications, vol. 33, No. 2, Mar./Apr. 1997, 11 pages.
Non-Final Office Action received for U.S. Appl. No. 14/251,174 dated Jun. 10, 2016, 20 pages.
Notice of Allowance received for U.S. Appl. No. 13/693,530 dated Jun. 23, 2015, 19 pages.
Restriction Requirement received for U.S. Appl. No. 14/251,174 dated Apr. 7, 2016, 6 pages.
U.S. Appl. No. 13/693,530 of Sarti, P. filed Dec. 4, 2012, 34 pages.
U.S. Appl. No. 14/251,174 of Sarti, P. filed Apr. 11, 2014, 45 pages.
U.S. Appl. No. 14/853,526 of Ebrahimzadeh, S. filed Sep. 14, 2015, 37 pages.
U.S. Appl. No. 14/873,585 of Sarti, P. filed Oct. 2, 2015, 40 pages.
U.S. Appl. No. 14/941,005 of Sarti, P. filed Nov. 13, 2015, 37 pages.
U.S. Appl. No. 14/958,648 of Sarti, P. filed Dec. 3, 2015, 39 pages.
Notice of Allowance received for U.S. Appl. No. 14/941,005 dated Feb. 1, 2017, 29 pages.
Notice of Allowance received for U.S. Appl. No. 16/149,741 dated Dec. 27, 2019, 53 pages.

* cited by examiner

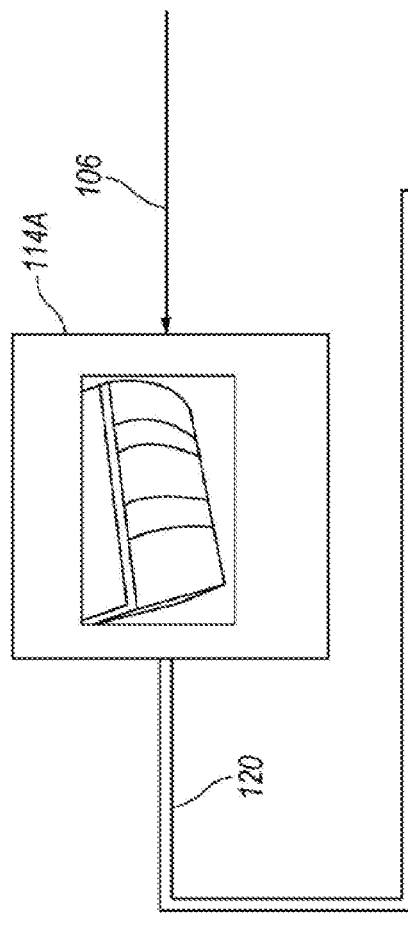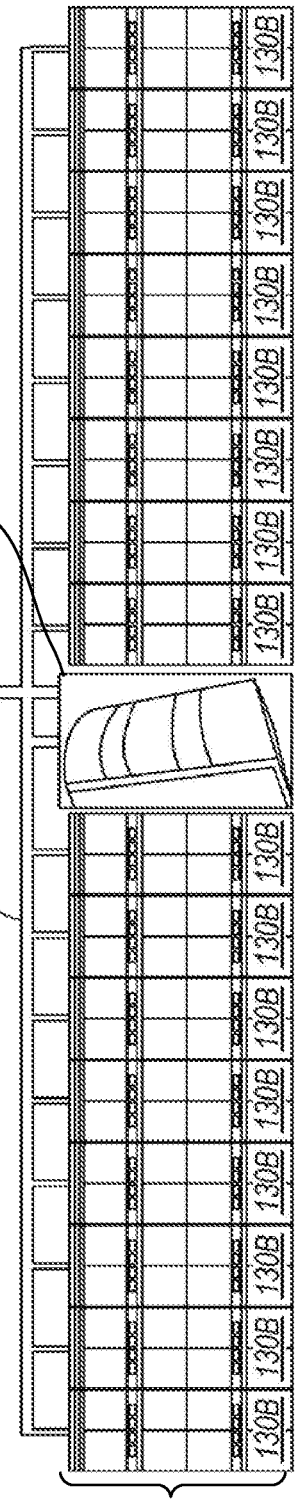
Fig. 1B
Fig. 1C

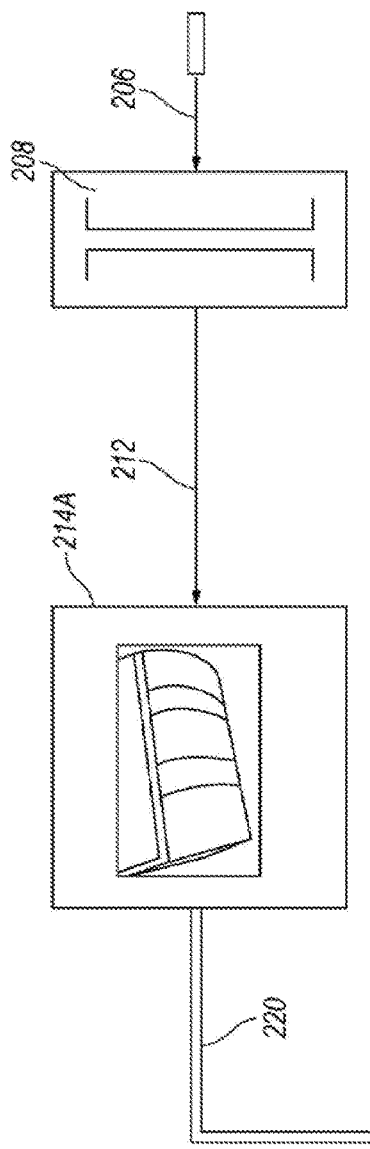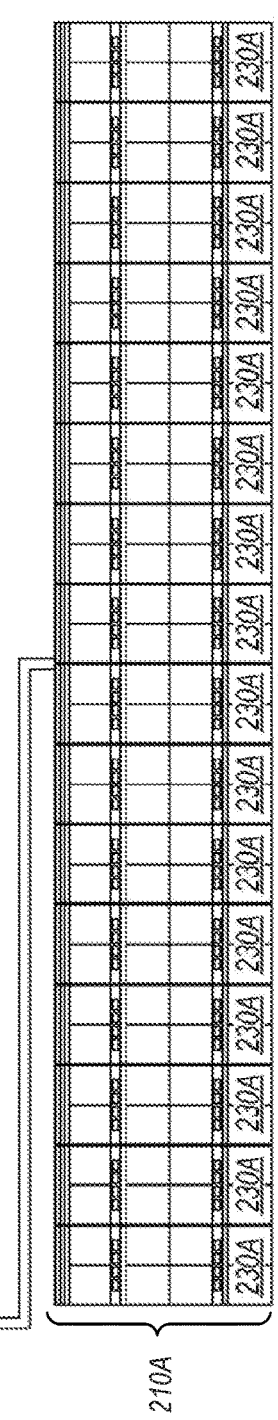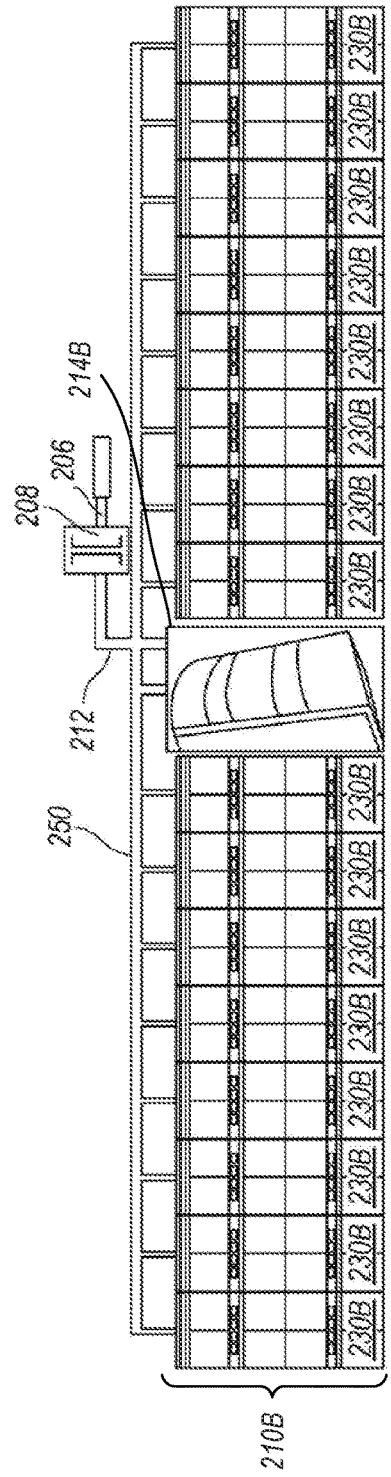
Fig. 2B
Fig. 2C

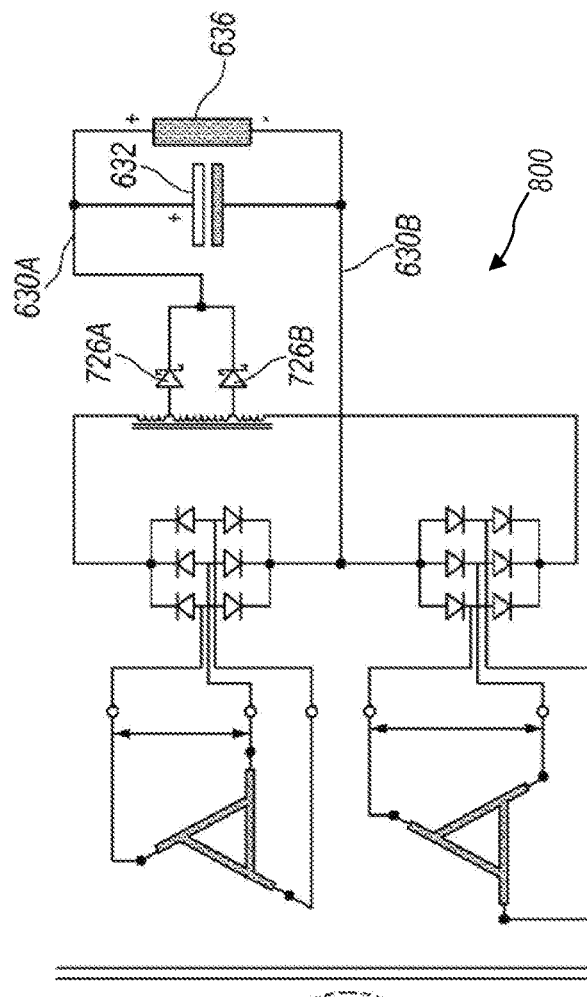
Fig. 8A
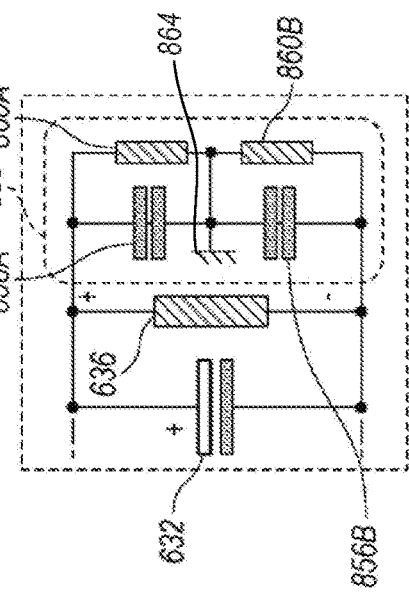
Fig. 8B
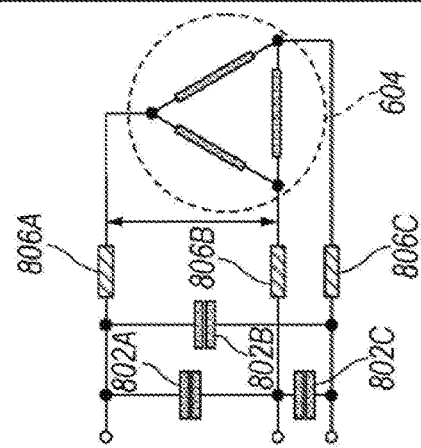

DATA CENTER SYSTEMS INCLUDING HIGH VOLTAGE DIRECT CURRENT POWER GENERATORS

CROSS-REFERENCE TO RELATED APPLICATION

This application is a divisional of U.S. patent application Ser. No. 16/149,741, titled "HIGH VOLTAGE DIRECT CURRENT POWER GENERATOR FOR COMPUTER SERVER DATA CENTERS," filed Oct. 2, 2018, which is a divisional of U.S. patent application Ser. No. 15/153,348, titled ""HIGH VOLTAGE DIRECT CURRENT POWER GENERATOR FOR COMPUTER SERVER DATA CENTERS," filed May 12, 2016, the entire disclosures of which are incorporated herein by this reference.

BACKGROUND

A data center is a practical solution for cloud computing, large-scale application services, or data services in information technology (IT) operations. One of the challenges of a data center is to provide uninterrupted power to computer server racks in the data center. Traditionally, a data center is connected to an alternating current (AC) grid. A server rack in the traditional data center converts the AC power to IT-usable direct current (DC) power via power supply modules. To ensure redundancy, the server rack includes multiple power supply modules in multiple power shelves in the server rack. The server rack can also include battery backup units (BBUs) that provide backup power when the power supply modules fail or when the AC grid experiences an outage or failure. The BBUs are often times placed in the power shelves as well. The power supply modules and the BBUs are heavy components that are difficult to maintain. The power supply modules and the BBUs generally last longer than computing servers in a server rack, but eventually need to be replaced and doing so is expensive. The bulky power shelves in the server rack can take up scarce real estate in the server rack and often have a low power distribution efficiency that makes the power consumption by the computing devices in the server rack costly.

BRIEF DESCRIPTION OF THE DRAWINGS

FIG. 1B is a block diagram illustrating a first example of a power delivery architecture of a single row of server racks in the first data center suite of FIG. 1A.

FIG. 1C is a block diagram illustrating a second example of a power delivery architecture of a single row of server racks in the first data center suite of FIG. 1A.

FIG. 2B is a block diagram illustrating a first example of a power delivery architecture of a single row of server racks in the second data center suite of FIG. 2A.

FIG. 2C is a block diagram illustrating a second example of a power delivery architecture of a single row of server racks in the second data center suite of FIG. 2A

FIG. 8A is a circuit diagram illustrating a PFC rectifier circuit, in accordance with at least one embodiment.

FIG. 8B is an expanded circuit diagram illustrating a grounding circuit for the PFC rectifier circuit, in accordance with at least one embodiment.

Figure 1A:
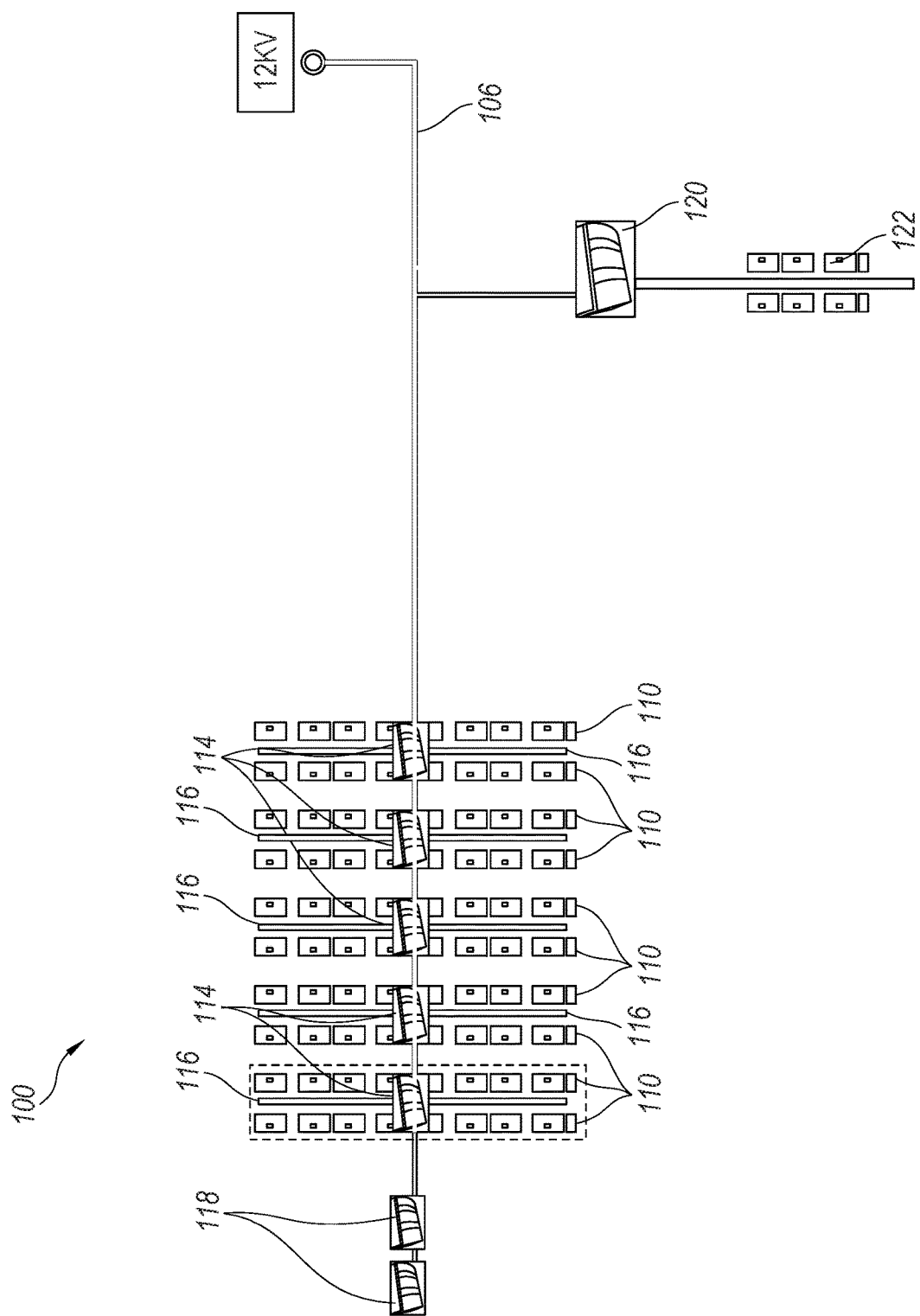
FIG. 1A is a schematic diagram illustrating an example architecture of a first data center suite implementing an HVDC power system, in accordance with some embodiments.

The figures depict various embodiments of the disclosure for purposes of illustration only. One skilled in the art will readily recognize from the following discussion that alternative embodiments of the structures and methods illustrated herein may be employed without departing from the principles of the invention described herein.

DETAILED DESCRIPTION OF EXAMPLE EMBODIMENTS

Various embodiments include a high voltage direct current (HVDC) power generator. The HVDC power generator can supply HVDC power to one or more rows of information technology (IT) racks (e.g., server racks) in a data center. Each IT rack can include one or more computer servers. Each IT rack can intake the HVDC power generated by the HVDC power generator to supply HVDC power to the computer servers. This architecture removes the need for PFC (Power Factor Correction) circuitry inside the IT racks. In one example, the HVDC can be in 380V DC. In another example, the HVDC can be in the range of 250 VDC to 400 VDC. In yet another example, the HVDC can be in the range of 24 VDC to 800 VDC.

The disclosed HVDC power distribution architecture differs from conventional AC distribution architectures. For example, under a conventional AC distribution architecture, each IT rack includes a power supply converting AC to DC (e.g., 277V AC to 12V DC). Each power supply can include a power factor correction (PFC) circuitry to ensure optimum power quality/power factor (PF) on AC power grid side. Power quality can be optimized by having a higher PF and lower AC sinusoidal Input Current Harmonic Distortion (iTHD). To ensure the Power Quality performances together with high electrical efficiency, a PFC circuitry produce a fixed DC voltage higher than the peak of its input AC sinusoidal voltage. This internal voltage of the PFC circuitry is usually between 370V to 440V.

In various embodiments, HVDC power distribution is enabled by an HVDC power generator. The HVDC power generator can include a 24-pulse rectification circuit (e.g., passive PFC rectifier circuit 500, PFC rectifier circuit 600, PFC rectifier circuit 700, and/or PFC rectifier circuit 800). The HVDC power generator can transform a high voltage AC (HVAC) power or a medium voltage AC power grid to HVDC. The HVDC voltage is comparable to the voltage generated traditionally by the PFC circuitry inside IT racks' AC-DC power supplies under the AC distribution architecture. Hence, various embodiments can re-use DC-DC converters in existing power supplies to step down the HVDC to IT-usable voltages.

HVDC power distribution can replace the traditional HVAC (e.g., 208V to 277V AC) power distribution. Various embodiments of the HVDC power distribution can provide high-power conversion from AC to HVDC at efficiency levels (e.g., 98%) comparable to the low-power PFC stage inside the power supplies of the conventional AC distribution architecture.

Various embodiments of the HVDC power distribution architecture also overcome various other technical challenges. Generating HVDC power from a single location for a data center facility may present safety and electrical efficiency loss challenges. Further, various devices and systems in a data center facility may still need AC voltage. In various embodiments, HVDC power distribution is disaggregated by having multiple HVDC power generators. The multiple HVDC power generators can increase the redundancy level of the overall power solution. Each data center hall, data center row, double-row, etc., may include an independent HVDC power generator. The data center can also include one or more redundant and normally OFF HVDC power generators to replace any HVDC power generators that fail. During the time between switching on the redundant HVDC power generators, the data center load can extract power from backup energy storage (e.g., battery or capacitor) available after any AC power grid outage occurrences. AC voltage can still be routed from an AC power grid to various devices and systems other than the IT racks.

Various embodiments pertain to an HVDC power generator capable of converting AC power to HVDC power. Utilizing an HVDC power architecture for the data centers may provide for high reliability (e.g., less than 20% power replacements after 15 years) (e.g., if a 100% passive solution is used). The disclosed HVDC power architecture also that enables the data center to disaggregate the conversion from high-voltage AC (HVAC) to HVDC (e.g., in a per-row or per-row-pair basis). The power conversion efficiency from HVDC to IT-usable voltage (e.g., 12V, 24V or 48V, etc . . . ) in accordance with various embodiments is higher than the conventional AC power distribution architecture.

Turning now to the figures, FIG. 1A is a schematic diagram illustrating an example architecture of a first data center suite 100 implementing an HVDC power system, in accordance with some embodiments. The first data center suite 100 can utilize a high voltage AC input from an external source (e.g., an AC power grid provided to the first data center suite 100). The first data center suite 100 can include an AC power bus 106. The AC power bus 106 can provide 12 kV AC power from the external source. For example, the high-voltage AC input can be delivered via the AC power bus 106 (e.g., an electrical cable capable of handling 20 Ampere of electrical current) to one or more HVDC power generators 114 electrically coupled to one or more server rack rows 110. In some embodiments, the HVDC power generators 114 are part of the server rack rows 110 (e.g., see FIG. 1C). In some embodiments, the HVDC power generators 114 are external to the server rack rows 110 that they serve (e.g., see FIG. 1B). The HVDC power generators 114 can provide HVDC power via one or more DC power buses 116.

In some embodiments, the first data center suite 100 can arrange the server rack rows 110 in pairs of "double rows," as shown in FIG. 1A. In some embodiments, at least one of the HVDC power generators 114 is near or at each pair of the server rack rows 110. In some embodiments, at least one of the HVDC power generators 114 is near or at each of the server rack rows 110. In some embodiments, each of the HVDC power generators 114 is electrically connected to the middle (e.g., along the length of the row) of a pair of server rack rows or a single server rack row. In these embodiments, the amount of conductors (e.g., copper) needed to prevent efficiency loss is significantly reduced as compared to connecting the HVDC power generators 114 at either ends of the server rack rows 110. For example, the AC power bus 106 can deliver HVAC input or medium voltage AC input to each of the HVDC power generators 114. The AC power bus 106, for example, can deliver 12 kV of AC input to the HVDC power generators 114.

In some embodiments, the first data center suite 100 includes one or more redundant HVDC power generators 118. The redundant HVDC power generators 118 can be implemented in the same way as the HVDC power generators 114. However, under normal operations, the redundant HVDC power generators 118 are either turned off or its power output is disconnected. In at least one of the HVDC power generators 114 fails or is incapable of sustaining a server rack load, HVDC output of at least one of the redundant HVDC power generators 118 is rerouted to replace the power output of the failed or incapacitated HVDC power generator (e.g., with backup power working in the meantime to support the IT racks during the rerouting switching).

In some embodiments, the first data center suite 100 includes one or more AC transformers 120. The AC transformers 120 can transform the AC input from the AC power bus 106 into AC output for one or more AC-based IT equipment 122.

FIG. 1B is a block diagram illustrating a first example of a power delivery architecture of a single row of server racks in the first data center suite 100 of FIG. 1A. The AC power bus 106 can be connected to an HVDC power generator 114A. The HVDC power generator 114A can transform the HVAC power into HVDC power. The HVDC power generator 114A can output the HVDC power via a DC power bus 120. For example, the DC power bus 120 can support up to 525 Amperes of electrical current. The DC power bus 120 can be electrically coupled to a server rack row 110A. The server rack row 110A can include a plurality of server racks 130A.

In some embodiments, the HVDC power generator 114B is specific for only the server rack row 110A. In some embodiments, the HVDC power generator 114B is specific for a pair of server rack rows, including the server rack row 110A. In some embodiments, the HVDC power generator 114B is a redundant HVDC power generator that can reroute power to replace one or more failed power generators.

In some embodiments, the DC power bus 120 can be electrically coupled to one side or the middle (e.g., along the length of the server rack row 110A) of the server rack row 110A. In the illustrated example, the DC power bus 120 can be electrically coupled between the eighth and the ninth server rack in the server rack row 110A.

FIG. 1C is a block diagram illustrating a second example of a power delivery architecture of a single row of server racks in the first data center suite 100 of FIG. 1A. Similar to the power delivery architecture of FIG. 1B, the AC power bus 106 can be connected to an HVDC power generator 114B. The HVDC power generator 114B can transform the high voltage AC power into HVDC power. Unlike the power delivery architecture of FIG. 1B, in FIG. 1C the HVDC power generator 114B can output the HVDC power via an in-row power bus 150 (e.g., coupled above the HVDC power generator 114B). The HVDC power generator 114B can have a chassis that enables the HVDC power generator 114B to fit within a server rack row 110B. The in-row power bus 150 can be electrically coupled to the server rack row 110B. The server rack row 110B can include a plurality of server racks 130B. In some embodiments, the HVDC power generator 114B can be positioned in the middle of the server rack row 110B along the length of the server rack row 110B. In the illustrated example, the HVDC power generator 114B can be electrically coupled between the eighth and the ninth server rack in the server rack row 110B.

Figure 2A:
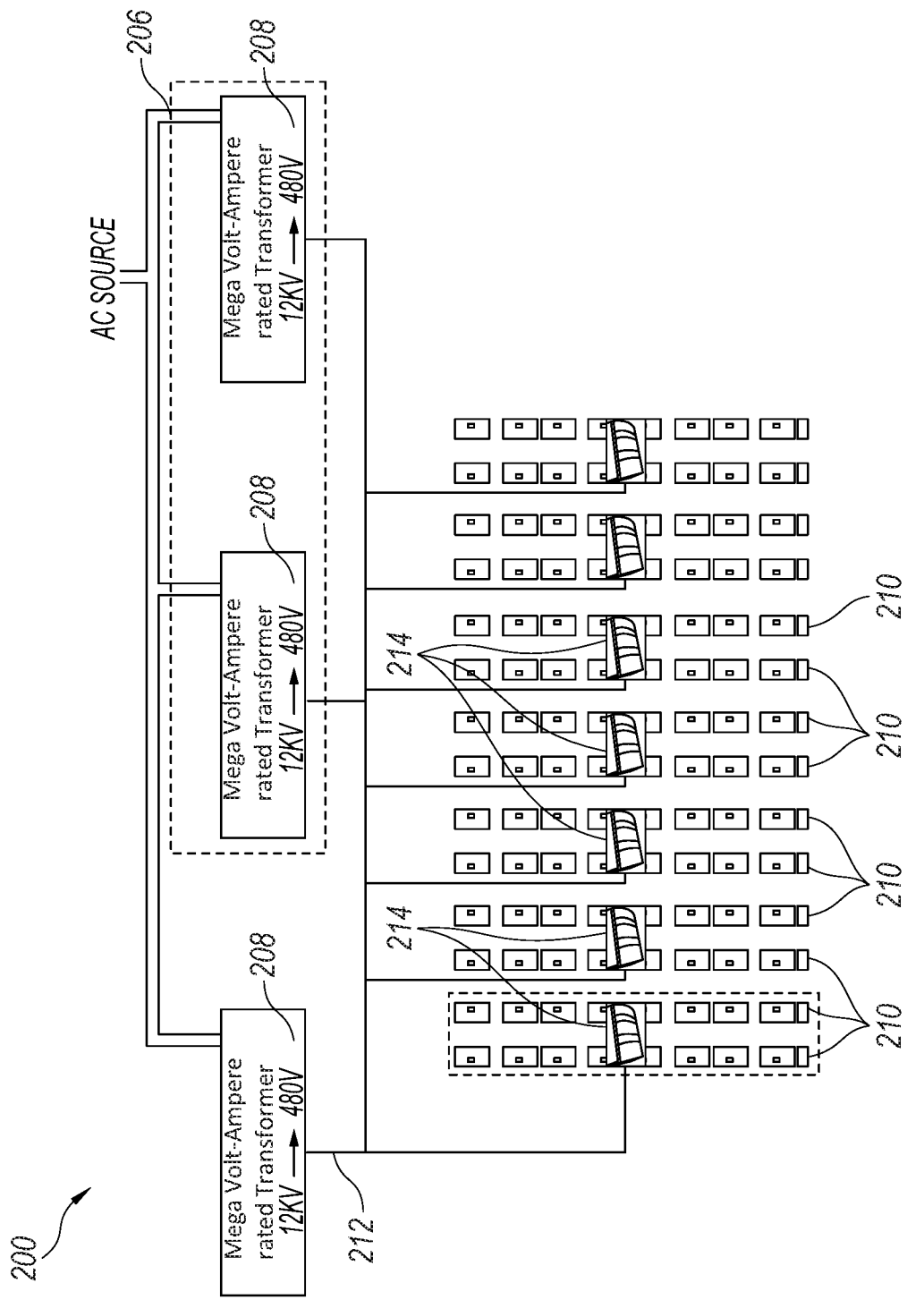
FIG. 2A is a schematic diagram illustrating an example architecture of a second data center suite implementing an HVDC power system, in accordance with some embodiments.

FIG. 2A is a schematic diagram illustrating an example architecture of a second data center suite 200 implementing an HVDC power system, in accordance with some embodiments. The second data center suite 200 can utilize an HVAC input from an external source (e.g., a standard AC power grid provided to the second data center suite 200). For example, the AC power bus 206 can provide 12 kV AC power from the external medium voltage source grid. The HVDC power system can include an AC power bus 206. The HVAC power can be delivered via the AC power bus 206 (e.g., an electrical cable capable of handling 300 Ampere of electrical current, for a total data center suite power not exceeding 10 MW) to one or more medium voltage transformers 208. The medium voltage transformers 208 can be step down transformers that lowers the voltage from the external source to a medium voltage AC power. The medium voltage transformers 208 can be electrically coupled to one or more HVDC power generators 214 via one or more medium voltage buses 212. For example, the medium voltage buses 212 can be capable of supplying up to 200 Ampere of electrical current. The HVDC power generators 214 can be electrically coupled to one or more server rack rows 210. In some embodiments, the HVDC power generators 214 are part of the server rack rows 210 (e.g., see FIG. 2C). In some embodiments, the HVDC power generators 114 are external to the server rack rows 210 that they serve (e.g., see FIG. 2B).

In some embodiments, the second data center suite 200 can arrange the server rack rows 210 in pairs of "double rows," as shown in FIG. 2A. In some embodiments, at least one of the HVDC power generators 214 is near or at each pair of the server rack rows 210. In some embodiments, at least one of the HVDC power generators 214 is near or at each of the server rack rows 210. In some embodiments, each of the HVDC power generators 214 is electrically connected to the middle (e.g., along the length of the row) of a pair of the server rack rows or a single server rack row. In these embodiments, the amount of conductors (e.g., copper) needed to prevent efficiency loss is significantly reduced as compared to connecting the HVDC power generators 214 at either ends of the pair of the server rack rows 210. For example, the AC power bus 206 can deliver the 12 kV AC input to each of the HVDC power generators 214.

In some embodiments, the second data center suite 200 includes one or more redundant HVDC power generators 216. The redundant HVDC power generators 216 can be implemented in the same way as the HVDC power generators 214. However, under normal operations, the redundant HVDC power generators 216 are either turned off or its power output is disconnected. In at least one of the HVDC power generators 214 fails or is incapable of sustaining a server rack load, HVDC output of at least one of the redundant HVDC power generators 216 is rerouted to replace the power output of the failed or incapacitated HVDC power generator.

FIG. 2B is a block diagram illustrating a first example of a power delivery architecture of a single row of server racks in the second data center suite 200 of FIG. 2A. The AC power bus 206 can be connected to a medium voltage transformer. The medium voltage transformer can output medium voltage AC power to an HVDC power generator 214A. The HVDC power generator 214A can transform the high voltage AC power into HVDC power. The HVDC power generator 214A can output the HVDC power via a DC power bus 220. For example, the DC power bus 220 can support up to 460 Amperes of electrical current. The DC power bus 220 can be electrically coupled to the server rack row 110A. The server rack row 210A can include a plurality of server racks 230A. In some embodiments, the DC power bus 220 can be electrically coupled to the middle of the server rack row 110A along the length of the server rack row 110A. In the illustrated example, the DC power bus 220 can be electrically coupled between the eighth and the ninth server rack in the server rack row 210A.

FIG. 2C is a block diagram illustrating a second example of a power delivery architecture of a single row of server racks in the second data center suite 200 of FIG. 2A. Similar to the power delivery architecture of FIG. 2B, the AC power bus 206 can be connected to an HVDC power generator 214B. The HVDC power generator 214B can transform the high voltage AC power into HVDC power. Unlike the power delivery architecture of FIG. 2B, in FIG. 2C the HVDC power generator 214B can output the HVDC power via an in-row power bus 250. The HVDC power generator 214B can have a chassis that enables the HVDC power generator 214B to fit within the server rack row 210B. The in-row power bus 250 can be electrically coupled to the server rack row 210B. The server rack row 210B can include a plurality of server racks 230B. In some embodiments, the HVDC power generator 214B can be positioned in the middle of the server rack row 210B along the length of the server rack row 210B. In the illustrated example, the HVDC power generator 214B can be electrically coupled between the eighth and the ninth server rack in the server rack row 210B.

Figure 3:
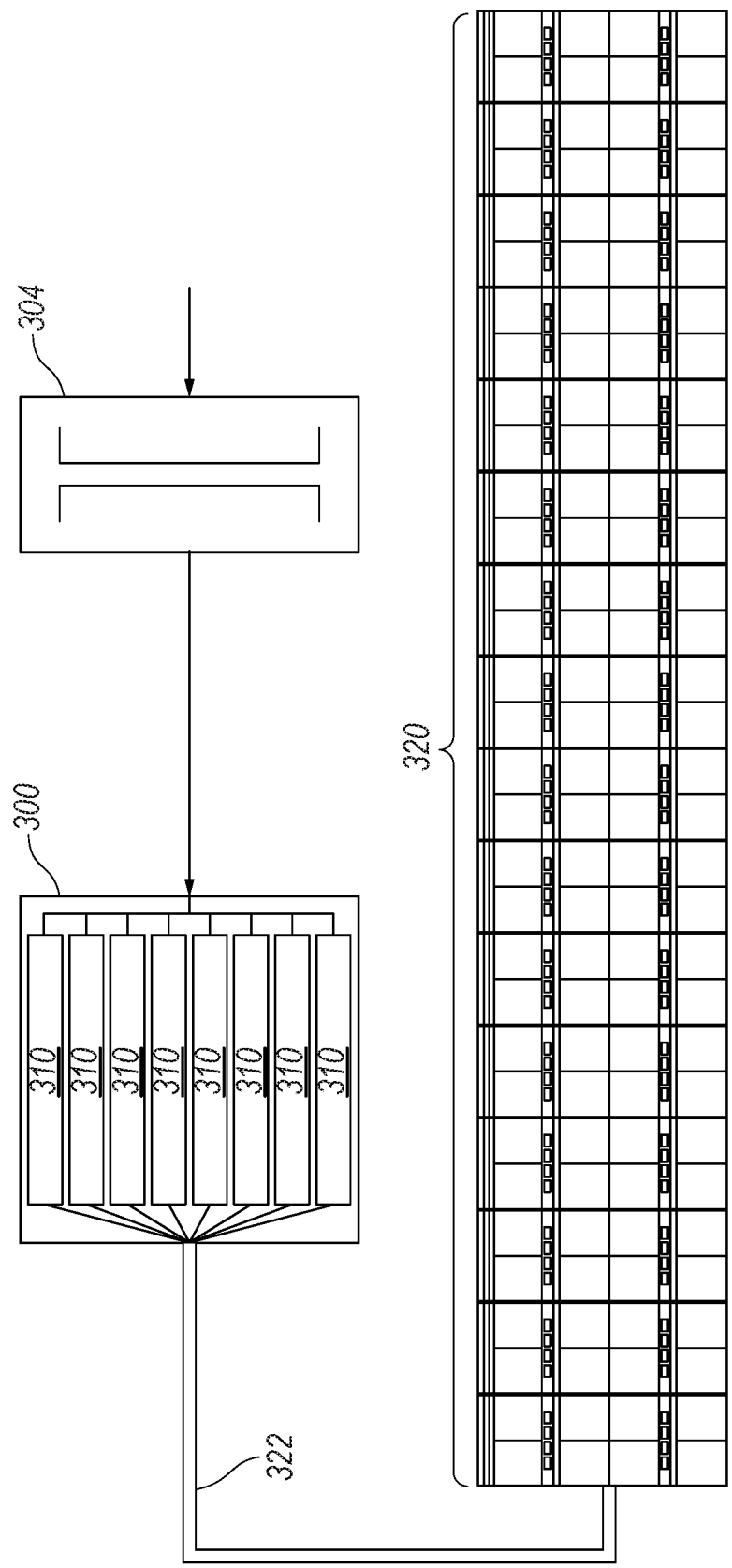
FIG. 3 is a block diagram illustrating a first example of in-row HVDC power distribution, in accordance with various embodiments.

FIG. 3 is a block diagram illustrating a first example of in-row HVDC power distribution, in accordance with various embodiments. A HVDC power generator 300 can be electrically coupled to an AC power source 304. For example, the HVDC power generator 300 can be the HVDC power generator 114A of FIG. 1B, the HVDC power generator 114B of FIG. 1C, the HVDC power generator 214A of FIG. 2B, or the HVDC power generator 214A of FIG. 2C. In the illustrated embodiment, the AC power source 304 is a medium voltage transformer (e.g., one of the medium voltage transformers 208 of FIG. 2A). In other embodiments, the AC power source 304 can be an AC power grid.

The HVDC power generator 300 can include one or more power factor correction (PFC) rectifier circuits 310 electrically coupled to one another in parallel. The HVDC output of the HVDC power generator 300 can be electrically coupled to an IT rack row 320 (e.g., a row of IT equipment, such as computer servers or network equipment) via an HVDC bus 322. The HVDC bus 322 can be the DC power bus 120 of FIG. 1B, the in-row power bus 150 of FIG. 1C, the DC power bus 220 of FIG. 2B, and/or the in-row power bus 150 of FIG. 2C. In these embodiments, backup power can be included within the IT rack row 320.

Figure 4:
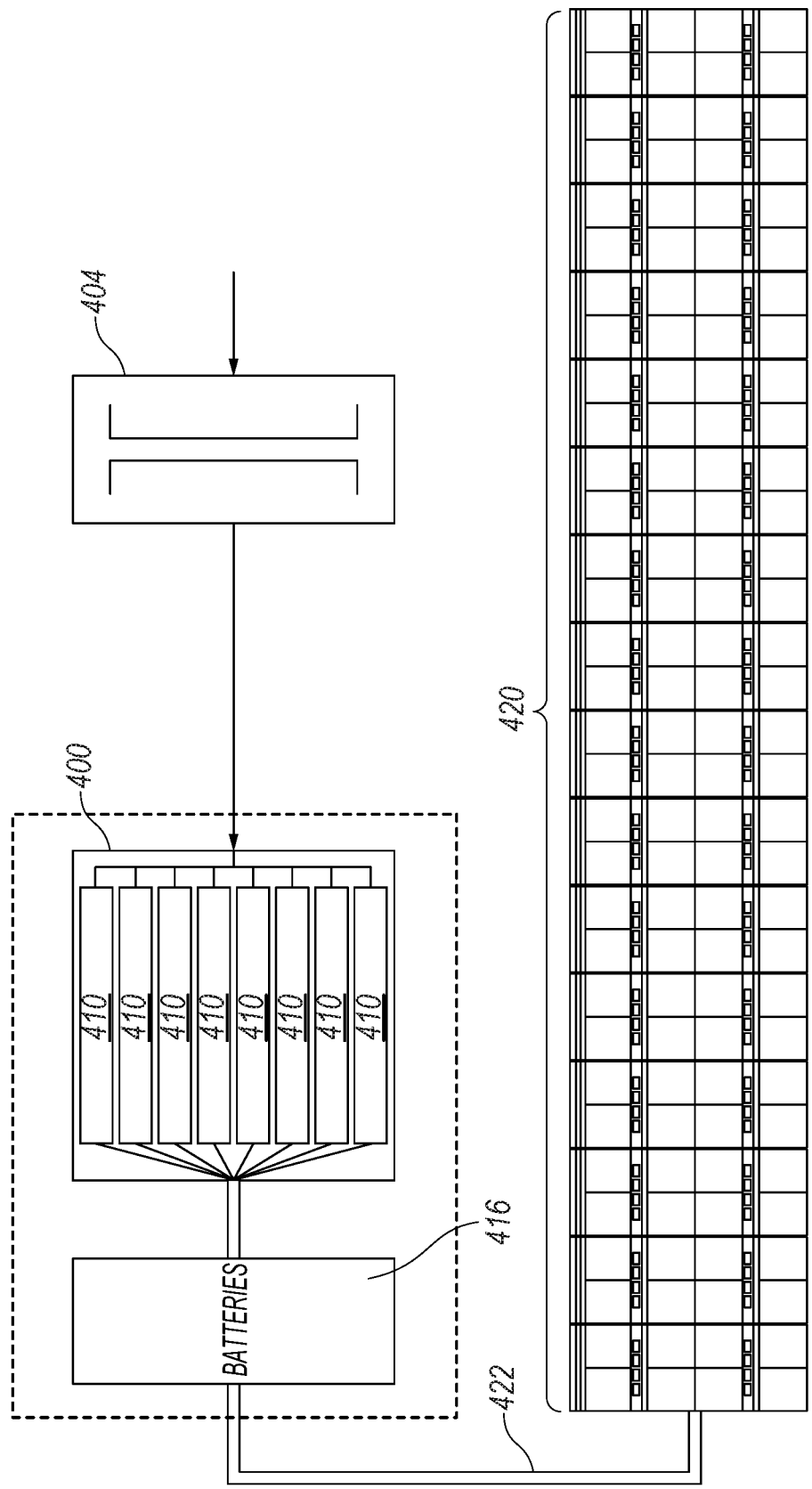
FIG. 4 is a block diagram illustrating a second example of in-row HVDC power distribution, in accordance with various embodiments.

FIG. 4 is a block diagram illustrating a second example of in-row HVDC power distribution, in accordance with various embodiments. A HVDC power generator 400 can be electrically coupled to an AC power source 404. For example, the HVDC power generator 400 can be the HVDC power generator 114A of FIG. 1B, the HVDC power generator 114B of FIG. 1C, the HVDC power generator 214A of FIG. 2B, or the HVDC power generator 214A of FIG. 2C. In the illustrated embodiment, the AC power source 404 is a medium voltage transformer (e.g., one of the medium voltage transformers 208 of FIG. 2A). In other embodiments, the AC power source 404 can be an AC power grid.

The HVDC power generator 400 can include one or more power factor correction (PFC) rectifier circuits 410 electrically coupled to one another in parallel. The HVDC output of the HVDC power generator 400 can be electrically coupled to external backup energy storage 416. The external backup energy storage 416 can be electrically coupled to an IT rack row 420 via an HVDC bus 422. The HVDC bus 422 can be the DC power bus 120 of FIG. 1B, the in-row power bus 150 of FIG. 1C, the DC power bus 220 of FIG. 2B, and/or the in-row power bus 150 of FIG. 2C. In these embodiments, backup power can provided external to the IT rack row 420 at the HVDC level.

Figure 5:
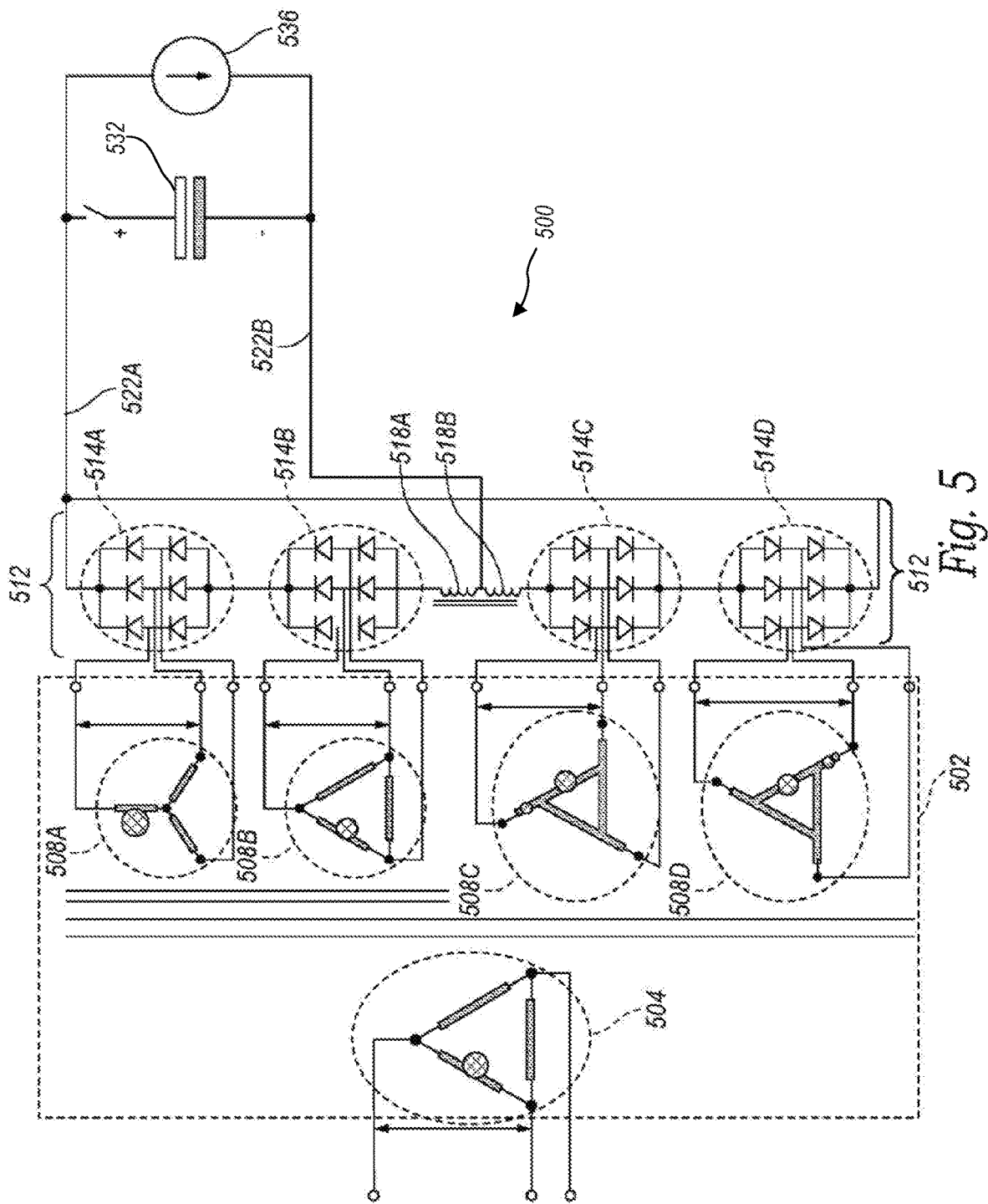
FIG. 5 is a circuit diagram illustrating a passive PFC rectifier circuit, in accordance with at least one embodiment.

FIG. 5 is a circuit diagram illustrating a passive PFC rectifier circuit 500, in accordance with at least one embodiment. The passive PFC rectifier circuit 500 can include a transformer 502 with a single primary winding 504 and four secondary windings (e.g., a secondary winding 508A, a secondary winding 508B, a secondary winding 508C, and a secondary winding 508D, collectively as the "secondary windings 508"). The single primary winding 504 can be electrically coupled to a three phase input AC source. The three phase input AC source can provide low voltage AC or medium voltage AC, depending on transformer primary specifics. The single primary winding 504 can have a Δ-configuration (e.g., also referred to as "delta configuration"). The secondary winding 508A can be a Y-configuration winding (e.g., also referred to as "wye-configuration") that provides a reference 0° phase of the three-phase voltages across the secondary windings. The secondary winding 508B can be a Δ-configuration winding that provides +30° phase shift. The secondary winding 508C can be an extended-delta configuration winding that provides a −15° phase shift. The secondary winding 508D can be a symmetric extended-delta configuration winding that provides a +15° phase shift.

The transformer 502 can be electrically coupled to bridge circuits 512 (e.g., one for each three-phase transformer secondary). For example, the bridge circuit 512 can include at least four bridge rectifiers (e.g., a bridge rectifier 514A, a bridge rectifier 514B, a bridge rectifier 514C, and a bridge rectifier 514D, collectively as the "bridge rectifiers 514"). The bridge rectifiers 514 can be three-phase full-wave bridge rectifiers. The secondary winding 508A can be electrically coupled to the bridge rectifier 514A. The secondary winding 508B can be electrically coupled to the bridge rectifier 514B. The secondary winding 508C can be electrically coupled to the bridge rectifier 514C. The secondary winding 508D can be electrically coupled to the bridge rectifier 514D.

The bridge rectifier 514A can be electrically coupled in series with the bridge rectifier 514B. These two rectifiers can further be electrically coupled in series with a first inductor 518A. The bridge rectifier 514C can be electrically coupled in series with the bridge rectifier 514D. These two rectifiers can further be electrically coupled in series with a second inductor 518B. In turn, the series of the bridge rectifier 514A, the bridge rectifier 514B, and the first inductor 518A ("the first rectifier series") can be electrically coupled, in parallel, to the series of the second inductor 518B, the bridge rectifier 514C, and the bridge rectifier 514D ("the second rectifier series"). The parallel connection between the rectifier series can be isolated by the adjacent inductors 518A and 518B. If the inductor 518A is coupled with the inductor 518B, the winding can be called "Interphase Reactor". At least one reason of using two inductors, or one Interphase Reactor, is to balance the output current of the two rectification circuits, which result in parallel.

Two ends of the parallel connection between the rectifier series provide a positive terminal 522A and a negative terminal 522B (collectively as the "output terminals 522") for HVDC power output. In one example, an energy storage 532 (e.g., a battery system or a capacitor system) can be electrically coupled in parallel to the rectifier series. In some embodiments, the energy storage 532 can provide internal backup power. In some embodiments, the energy storage 532 can prevent dips in the HVDC output power during brownout, temporary blackout, or temporary failure of one or more components in the passive PFC rectifier circuit 500. In another example, an electrical load 536 (e.g., constant or dynamic power load) can be electrically coupled in parallel to the output terminals 522 to draw HVDC output. Because the passive PFC rectifier circuit 500 outputs 24 pulses of DC per AC cycle, and electrically couples rectifier series in parallel, the passive PFC rectifier circuit 500 can be considered a 24-pulse parallel (24P parallel) rectifier system.

Generally, the more DC pulses that can be generated by a rectifier system within a single AC cycle, the higher PF (and lower iTHD) would be for the rectifier system on the AC input side. Because the passive PFC rectifier circuit 500 is able to produce at least 24 pulses in parallel, during one whole sinusoidal cycle of the input AC voltage, the Power Quality of the passive PFC rectifier circuit 500 is high enough to support a data center of computer servers. Having more pulses per AC cycle also smooths out the HVDC output ripple of the passive PFC rectifier circuit 500.

Figure 6:
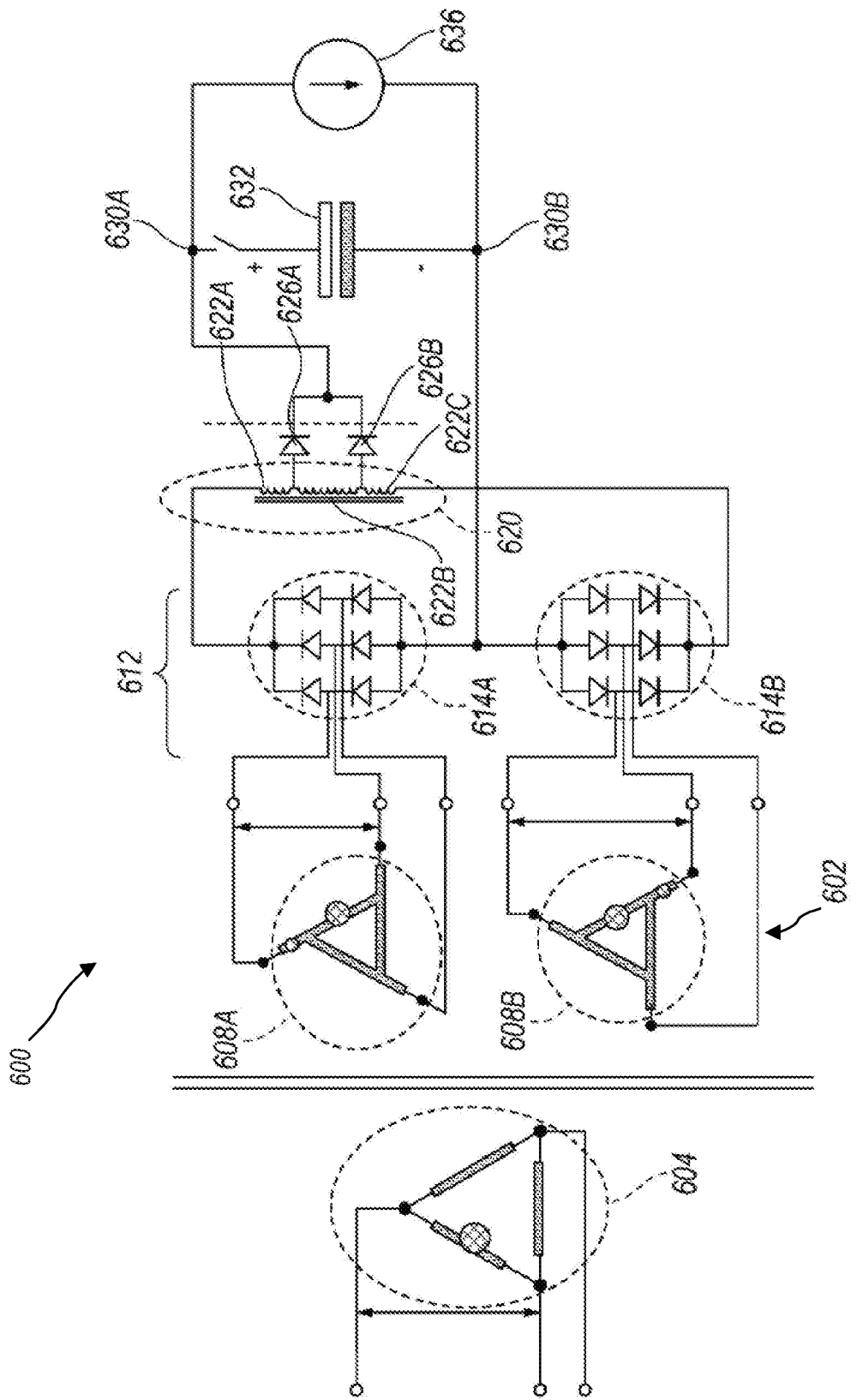
FIG. 6 is a circuit diagram illustrating a PFC rectifier circuit, in accordance with at least one embodiment.

FIG. 6 is a circuit diagram illustrating a PFC rectifier circuit 600, in accordance with at least one embodiment. The PFC rectifier circuit 600 can include a transformer 602 with a single primary winding 604 and two secondary windings (e.g., a secondary winding 608A and a secondary winding 608B, collectively as the "secondary windings 608"). The single primary winding 604 can be electrically coupled to a three phase input AC source. The single primary winding 604 can have a Δ-configuration. The secondary winding 608A can be an extended-delta configuration winding that provides +15° phase shift. The secondary winding 608B can be an extended-delta configuration winding that provides a −15° phase shift.

The transformer 602 can be electrically coupled to a bridge circuit 612. For example, the bridge circuit 612 can include two bridge rectifiers (e.g., a bridge rectifier 614A and a bridge rectifier 614B, collectively as the "bridge rectifiers 614"). The bridge rectifiers 614 can be three-phase full-wave bridge rectifiers. The secondary winding 608A can be electrically coupled to the bridge rectifier 614A. The secondary winding 608B can be electrically coupled to the bridge rectifier 614B.

The bridge rectifier 614A and the bridge rectifier 614B can be electrically coupled in parallel with an interphase reactor circuit 620 electrically coupled there between. The interphase reactor circuit 620 provides a balanced system operation when both rectifier circuits are conducting by acting as an inductive voltage divider and thus an automatic voltage compensator. The interphase reactor circuit 620 can include, for example, three inductors coupled in series (a first inductor 622A, a second inductor 622B, and a third inductor 622C. In some embodiments, the second inductor 622B can have higher inductance (e.g., twice the amount of inductance) than the first inductor 622A and the third inductor 622C, individually. The outputs of the inductive voltage divider can be forwarded into diodes (e.g., a diode 626A and a diode 626B). The diode 626A can be connected between the first inductor 622A and the second inductor 622B, allowing electrical current to flow away from the inductors. The diode 626B can be connected between the second inductor 622B and the third inductor 622C, allowing electrical current to flow away from the inductors. The interphase reactor circuit 620 and the diodes 626A and 626B can make the output current of the bridge rectifiers twice pulse-modulated, and thereby causing an otherwise 12-pulse rectifier system to exhibit 24-pulse rectifier characteristics. The interphase reactor circuit 620 and the diodes 626A and 626B can provide smooth AC side quality performance and DC output ripple voltage (e.g., equal to a parallel 24P system as in FIG. 5 with the efficiency and cost similar to a parallel 12P system).

The outputs of the diodes 626A and 626B can be connected together as a positive terminal 630A for an HVDC power output. The common negative terminal between the bridge rectifiers 614A and 614B can be a negative terminal 630B for the HVDC power output. The positive and negative terminals 630A and 630B can be collectively referred to as the "output terminals 630." In one example, an energy storage 632 (e.g., a battery system or a capacitor system) can be electrically coupled in parallel to the positive and negative terminals 630A and 630B. In some embodiments, the energy storage 632 can provide internal backup power. In some embodiments, the energy storage 632 can prevent dips in the HVDC output power during brownout, support strong load power peaks, temporary blackout, or temporary failure of one or more components in the PFC rectifier circuit 600. In another example, an electrical load 636 (e.g., constant or dynamic power load) can be electrically coupled in parallel to the positive and negative terminals 630A and 630B to draw HVDC power. Because various embodiments of the PFC rectifier circuit 600 include passive components only, the PFC rectifier circuit 600 can be considered a passive rectification circuit.

Generally, the more DC pulses that can be generated by a rectifier system within a single AC cycle, the higher PF (and the lower iTHD) would be for the rectifier system. The PFC rectifier circuit 600 is able to produce at least 24 pulses in parallel similar to the passive PFC rectifier circuit 500 by using the interphase reactor circuit 620 and the diode 626A and 626B. Accordingly, the Power Quality of the PFC rectifier circuit 600 is high enough to support a data center of computer servers. Having more pulses per AC cycle also smooths out the HVDC output of the PFC rectifier circuit 600. The PFC rectifier circuit 600 uses a smaller number of windings for the transformer 602 and bridge rectifiers for the bridge circuit 612 as compared to the passive PFC rectifier circuit 500, and hence the cost of the PFC rectifier circuit 600 would be lower than the passive PFC rectifier circuit 500. The efficiency of the PFC rectifier circuit 600 may be slightly higher as well than the passive PFC rectifier circuit 500 because of total less diodes count in series and a better transformer efficiency.

Figure 7:
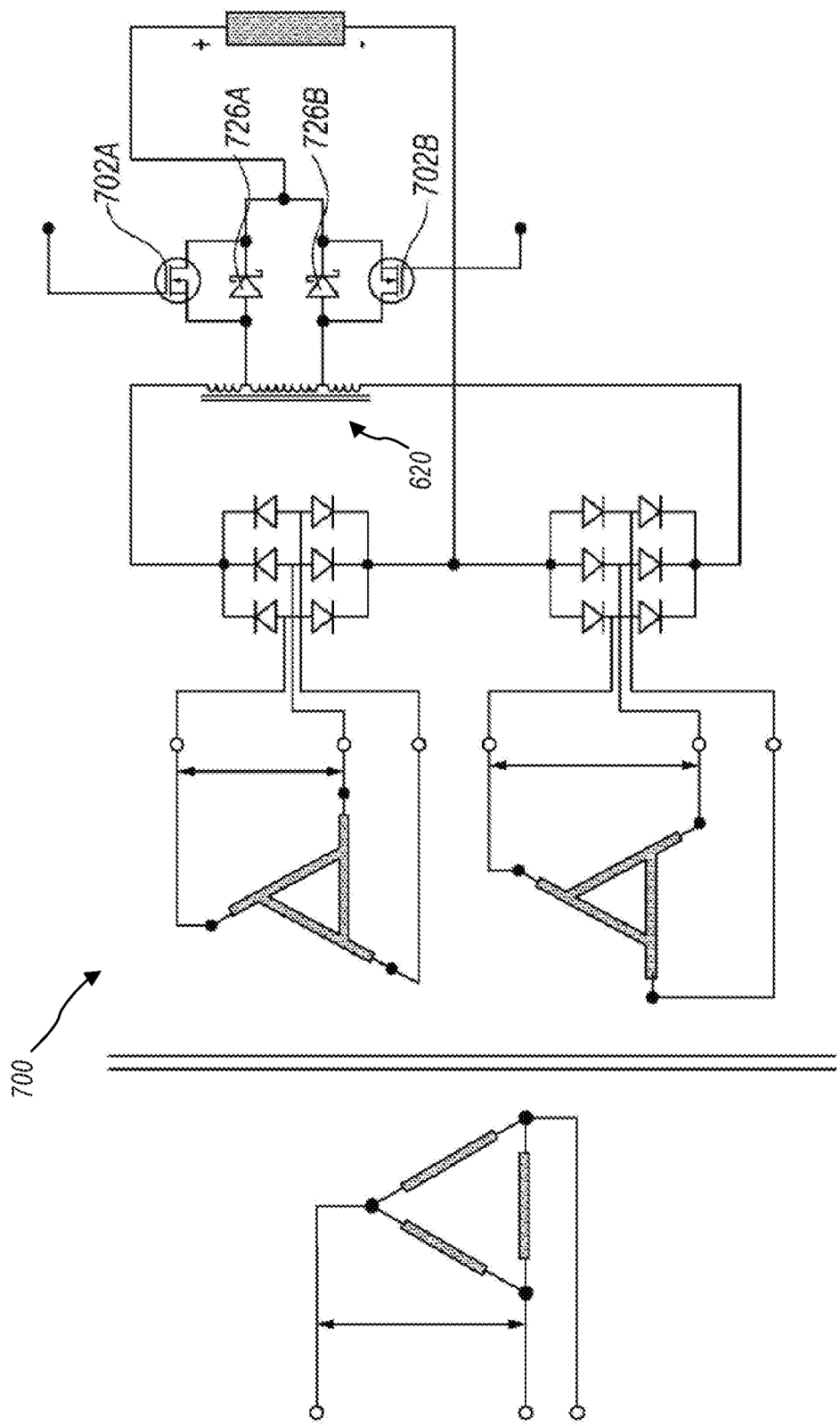
FIG. 7 is a circuit diagram illustrating a PFC rectifier circuit, in accordance with at least one embodiment.

FIG. 7 is a circuit diagram illustrating a PFC rectifier circuit 700, in accordance with at least one embodiment. The PFC rectifier circuit 700 can be substantially similar to the PFC rectifier circuit 600 of FIG. 6 except for the following differences as described. The PFC rectifier circuit 700 includes the interphase reactor circuit 620, similar to the PFC rectifier circuit 600. However, diodes 726A and 726B connected to the interphase reactor circuit 620 are Schottky diodes. In other embodiments, the diodes 726A and 726B can be other types of diodes.

Transistors 702 (e.g., a transistor 702A and a transistor 702B) can be electrically coupled respectively in parallel to the diodes 726A and 726B. The transistors 702A and 702B can be metal oxide semiconductor (MOS) transistors (e.g., N-channel MOS transistors). The transistors 702A and 702B can reduce the efficiency loss across the diodes 726A and 726B. In some embodiments, the PFC rectifier circuit 700 can have a 0.2% electrical efficiency gain at any loads compared to the PFC rectifier circuit 600. Because various embodiments of the PFC rectifier circuit 700 include the transistors 702A and 702B, which involve placing an active voltage across the gates of the transistors 702A and 702B to operate, the PFC rectifier circuit 700 can be considered an active rectification circuit.

FIG. 8A is a circuit diagram illustrating a PFC rectifier circuit 800, in accordance with at least one embodiment. The PFC rectifier circuit 700 can be substantially similar to the PFC rectifier circuit 600 of FIG. 6 except for the following differences as described. The PFC rectifier circuit 800 includes the transformer 602. The PFC rectifier circuit 800 can include the diodes 626A and 626B of FIG. 6 or the diodes 726A and 726B of FIG. 7.

The PFC rectifier circuit 800 can include a plurality of input phase capacitors (e.g., an input phase capacitor 802A, an input phase capacitor 802B, and an input phase capacitor 802C, collectively as the "input phase capacitors 802"). Each of the input phase capacitors 802 can be electrically coupled between a pair of the input phases connected to the primary winding 604. The input phase capacitors 802 can optimize the PF at approximately 75% electrical load (e.g., hence achieving PF=0.999 at usual system load). The input phase capacitors 802 can also lower iTHD of the PFC rectifier circuit 800. In some embodiments, the input phase capacitors 802 can also apply to the input phases of the passive PFC rectifier circuit 500 of FIG. 5 and the PFC rectifier circuit 700 of FIG. 7.

The PFC rectifier circuit 800 can include a plurality of input phase inductors (e.g., an input phase inductor 806A, an input phase inductor 806B, and an input phase inductor 806C, collectively as the "input phase inductor 806"). The input phase inductors 806 can be respectively coupled to the input phases of the transformer 602 (e.g., the input phases of the primary winding 604). The input phase inductors 806 can help balance output currents of the secondary windings 608. The input phase inductors 806 can also help lower iTHD of the PFC rectifier circuit 800. The input phase inductors 806 can limit the change in electrical current over time, and hence lower startup current. The input phase inductors 806 can further limit secondary short-circuit current of the transformer 602. In some embodiments, the input phase inductors 806 can also apply to the input phases of the passive PFC rectifier circuit 500 of FIG. 5 and the PFC rectifier circuit 700 of FIG. 7.

FIG. 8B is an expanded circuit diagram illustrating a grounding circuit 850 for the PFC rectifier circuit 800, in accordance with at least one embodiment. The grounding circuit 850 can be coupled in parallel to the output terminals 630, the energy storage 632, and the electrical load 636. A capacitive voltage divider (e.g., including an upper ground capacitor 856A and a lower ground capacitor 856B) and a resistive voltage divider (e.g., including an upper ground resistor 860A and a lower ground resistor 860B) can both be electrically coupled between the output terminals 630. An electrical ground 864 can be coupled between the upper ground resistor 860A and the lower ground resistor 860B and between the upper ground capacitor 856A and the lower ground capacitor 856B. The capacitive voltage divider and the resistive voltage divider can ensure that the electrical ground 864 has an electrical potential equal distance from the output terminals 630.

Figure 9:
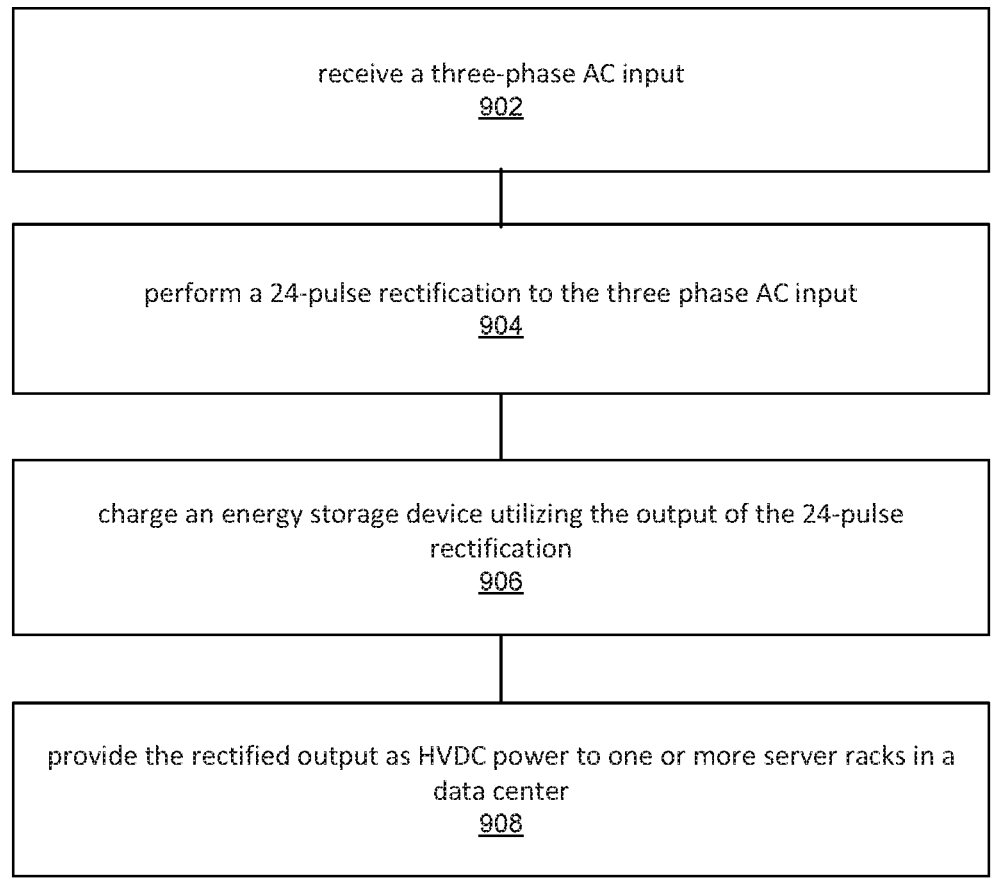
FIG. 9 is a method of operating an HVDC power system, in accordance with various embodiments.

FIG. 9 is a method 900 of operating an HVDC power system, in accordance with various embodiments. In block 902, a PFC rectifier circuit (e.g., the passive PFC rectifier circuit 500, the PFC rectifier circuit 600, the PFC rectifier circuit 700, or the PFC rectifier circuit 800) can receive a three-phase AC input (e.g., from a medium voltage transformer or a high-voltage AC grid). In block 904, the PFC rectifier circuit can perform a 24-pulse rectification to the three phase AC input. Here, "24-pulse rectification" refers to a rectification process with 24 DC pulses or more than 24 DC pulses per AC cycle. For example, in each AC cycle, there are three positive pulses and three negative pulses corresponding to the three phases. The PFC rectifier circuit can rectify the negative pulses as well as splitting each pulse into four separate pulses with different phase delays (e.g., 15°, 30°, −15°, and −30°). In total, the PFC rectifier circuit can generate 24 pulses per AC cycle.

Optionally, in block 906, the PFC rectifier circuit charges an energy storage device (e.g., a capacitor system or a battery system) utilizing the output of the 24-pulse rectification. In block 908, the PFC rectifier circuit can provide the rectified output as HVDC power to one or more server racks in a data center.

While processes or methods are presented in a given order, alternative embodiments may perform routines having steps, or employ systems having blocks, in a different order, and some processes or blocks may be deleted, moved, added, subdivided, combined, and/or modified to provide alternative or sub-combinations. Each of these processes or blocks may be implemented in a variety of different ways. In addition, while processes or blocks are at times shown as being performed in series, these processes or blocks may instead be performed in parallel, or may be performed at different times.

Some embodiments of the disclosure have other aspects, elements, features, and steps in addition to or in place of what is described above. These potential additions and replacements are described throughout the rest of the specification. A reference in this specification to "various embodiments" or "some embodiments" means that a particular feature, structure, or characteristic described in connection with the reference is included in at least one embodiment of the disclosure. Alternative embodiments (e.g., referenced as "other embodiments") are not mutually exclusive of other embodiments. Moreover, various features are described which may be exhibited by some embodiments and not by others. Similarly, various requirements are described which may be requirements for some embodiments but not other embodiments.

What is claimed is:

1. A data center system, comprising:
   a power factor correction (PFC) rectification circuit coupled to a three-phase alternating current (AC) source, wherein the PFC rectification circuit is configured to produce a high voltage direct current (HVDC) power output;
   a row of information technology (IT) racks; and
   an HVDC power generator electrically coupled between the PFC rectification circuit and the row of IT racks, wherein the HVDC power generator is physically positioned in and connected to a middle portion of the row of IT racks along a length of the row of IT racks.

2. The data center system of claim 1, further comprising a redundant PFC rectification circuit configured to replace a plurality of PFC rectification circuits in the data center system in response to detecting at least one of the plurality of PFC rectification circuits has failed or is malfunctioning.

3. The data center system of claim 1, wherein the PFC rectification circuit is a 24-pulse PFC rectification system.

4. The data center system of claim 1, wherein the three-phase AC source is an AC-AC medium voltage transformer or an AC power grid.

5. The data center system of claim 1, further comprising another row of IT racks adjacent to the row of IT racks, wherein the HVDC power generator comprises a single HVDC power generator coupled to a middle portion of both the row of IT racks and the other row of IT racks.

* * * * *